Nov. 30, 1965 K. ERTEL 3,221,261

AMPLIFYING SYSTEM INCLUDING A PUSH-PULL PREAMPLIFIER AND OUTPUT SWITCHING AMPLIFIER

Filed Aug. 14, 1962

3,221,261

AMPLIFYING SYSTEM INCLUDING A PUSH-PULL PREAMPLIFIER AND OUTPUT SWITCHING AMPLIFIER

Karl Ertel, Nurnberg, Germany, assignor to Siemens-Schuckertwerke Aktiengesellschaft, Berlin-Siemensstadt, and Erlangen, Germany, a corporation of Germany Filed Aug. 14, 1962, Ser. No. 216,930
Claims priority, application Germany, Aug. 16, 1961, S 75,307
5 Claims. (Cl. 330—6)

Figure 1:
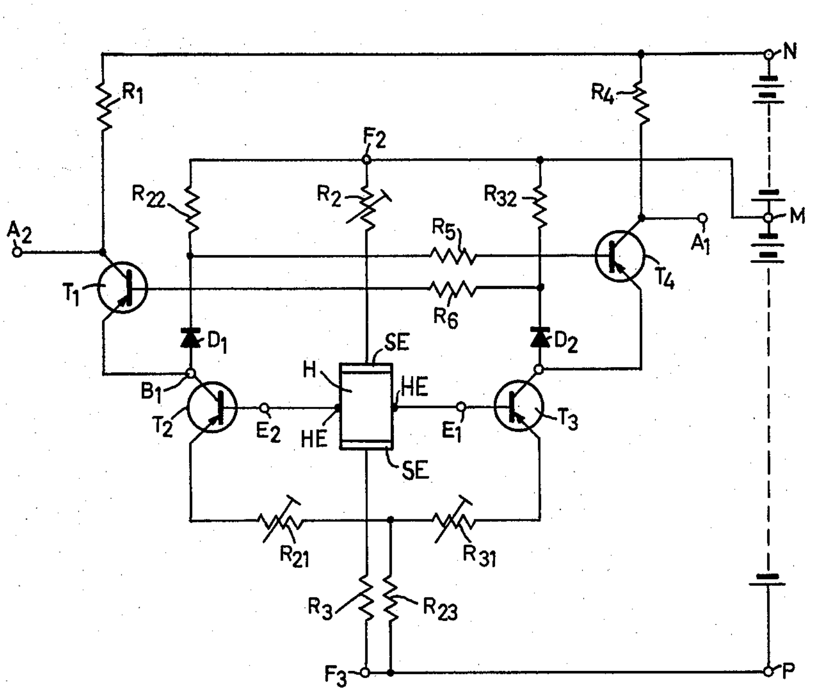

My invention relates to amplifiers for matching sensors, transducers, or other transmitters of weak signal voltages to the voltage and power requirements of signal-responsive components of a control or regulating system.

An object of my invention is to provide an amplifier for the outputs of signal transmitters furnishing only a weak voltage signal, which amplifier can nevertheless reliably produce a much stronger signal capable of variation and use by a control system, switch, or the like. Conventional control systems operating without movable switch contacts usually require a voltage of about 10 volts in order to be properly processed or attenuated according to the system logic.

More particularly it is an object of the invention to provide amplifyinng means for proximity-type of detectors, transducers, error detectors or transmitters such as photoelectric cells, magnetic pick-ups, Hall-voltage generators, etc., as well as for non-proximity type devices such as temperature gauges, pressure-responsive capsules, wire strain gauges and other transducers operating to translate a change in physical magnitude into a corresponding electrical change of voltage or current.

Another object of my invention is to provide a small-signal amplifier which is so stabilized that a change of its supply voltage or ambient temperature does not change its amplifying properties, but which nevertheless is compact and relatively inexpensive.

Still another object of the invention is to provide a stable, compact, simple amplifier satisfying not only the above objects but also providing a control current for energizing a Hall-voltage generator which furnishes the input signals, the current having fluctuations which are minimized to such an extent that they can at most follow the slight undulation in feed voltage applied to the amplifier.

According to my invention, the voltage of the detector or transmitter member, such as one of the above-mentioner error detectors, Hall generators and other sensors or transducers, furnishing a minute direct voltage of reversible polarity, is first impressed upon a symmetrical preamplifier push-pull circuit. The output leads of the pre-amplifier circuit furnish an amplified push-pull voltage which changes its polarity in dependence upon the polarity of the original signal voltage. The push-pull voltage is supplied to two switching amplifiers for selectively controlling one of them, depending upon the polarity of the push-pull voltage, to issue an amplified output signal, such as a voltage or current, suitable for processing by the signal-responsive components of a control system.

The pre-amplifier circuit as well as the two switching amplifiers, preferably can be accommodated in a common housing which is preferably sealed or filled with casting resin. For reliably securing a response of the control portion only when the amplifier furnishes a given minimum output voltage, it is a feature of the invention to connect a threshold-value determining member, for example a diode, in the input stage of each of the two switching amplifiers.

An amplifier according to the invention is particularly suitable for matching a Hall generator to the signal-responsive components to be controlled by the generated Hall voltage. In conjunction with such Hall generators it is another object of my invention to provide a simple amplifying device which not only meets the above-mentioned requirements but also provides a control current for energizing the Hall plate and whose fluctuations are minimized to such an extent that they can at most follow the slight fluctuations in feed voltage applied to the amplifier.

In accordance with another feature of my invention, the control current for the Hall plate and the operating current for the Hall-voltage amplifier are taken from an only lightly loaded current source or battery, whereas the operating current for the switching amplifier is supplied from another current source or battery. Thus, for example, the control current of the Hall plate as well as the operating current of the Hall-voltage amplifier are taken from the P–M half-portion of a battery having a mid-tap M, and the operating current for the switching amplifiers is taken from the N–M half-portion of the same direct-current battery, P denoting the plus pole, N the minus pole, and M the mid-tap of the battery. It will be understood, of course, that the poles P, N and M may also be constituted by the terminals and a mid-tap of a voltage divider.

Figure 2:
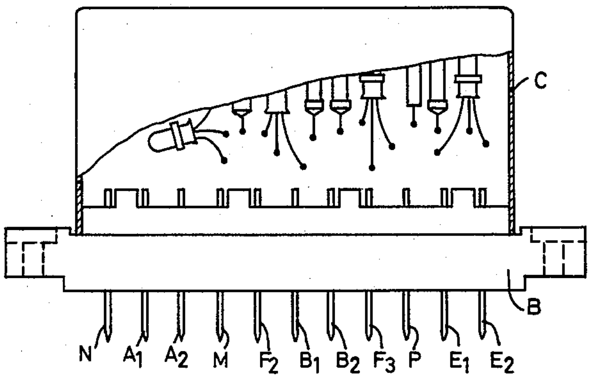

The above-mentioned and more specific objects, advantages and features of my invention, said features being set forth with particularity in the claims annexed hereto, will be apparent from, and will be described in, the following with reference to the embodiment of a sensor matching amplifier according to the invention illustrated by way of example in the accompanying drawings, in which:

FIG. 1 is a schematic circuit diagram of the amplifier according to the invention, and FIG. 2 shows, partly schematically, a plug-type design of the amplifier not including the sensor and the current sources.

The sensor or transducer schematically shown at H in FIG. 1 consists of a Hall generator, namely, of a rectangular plate or wafer of semiconductor materials such as indium antimonide (InSb) or indium arsenide (InAs) which carries two current supply electrodes SE along its narrow edges and is provided with two probe or Hall electrodes HE on the respective long edges midway between the two current supply electrodes. When such a Hall plate is traversed by electric current between the supply electrodes SE, the two probe electrodes HE have the same electric potential as long as no magnetic field acts upon the plate. However, when the plate is subjected to a magnetic field having a component perpendicular to the plane of the plate, the two probe electrodes assume respectively different potentials so that a voltage, the so-called Hall voltage, appears between these electrodes. The Hall voltage is proportional to the strength of the magnetic field component perpendicular to the plane of the plate, relative to a constant control current passing through the Hall plate, and the polarity of the Hall voltage depends upon the direction of the magnetic field. It will be understood that such a Hall generator is well suitable as a proximity-type detector. For example, when a permanent magnet or a magnetic signal approaches the Hall plate H, a corresponding positive or negative voltage signal is generated between the Hall electrodes, thus permitting the device to be used as a signal transmitter for position or travel responsive control and regulating purposes, for example.

The Hall voltage, usually being a small fraction of one volt, is insufficient to operate directly control components, such as static-type or contact-less logic circuit components, that require an operating voltage in the order of 10 volts.

The illustrated amplifier for augmenting the signal voltage to the necessary value comprises two transistors $T_2$ and $T_3$ whose respective bases are connected to signal input terminals $E_2$ and $E_1$ respectively. The Hall electrodes HE of the Hall plate H are connected to these two terminals. The emitters of the transistors $T_2$ and $T_3$ are connected through respective calibrating resistors $R_{21}$ and $R_{31}$ with a common emitter resistor $R_{23}$. The latter has its other end connected to the plus pole P of a direct-voltage source S whose midpoint or reference point is denoted by M and whose negative pole is denoted by N. The collector of transistor $T_2$ is connected through a diode $D_1$ and a collector resistor $R_{22}$ with the reference point M of the voltage source S. The collector of transistor $T_3$ is connected through a diode $D_2$ and a collector resistor $R_{32}$ with the same reference point M.

The above-mentioned control current needed for operating the Hall generator H is likewise taken from the M–P half portion of the direct-voltage source and is supplied to the plate H through resistors $R_2$ and $R_3$.

The magnetic field required for activating the Hall generator acts in a direction perpendicular to the plane of illustration. When such a magnetic field is not present, the Hall voltage across the input terminals $E_1$ and $E_2$ is equal to zero. The working point of the preamplifying transistors $T_2$ and $T_3$ is symmetrically adjusted by means of the resistors $R_{21}$, $R_{31}$ and $R_{23}$. If, under these conditions, a voltmeter having a zero indication in the middle of its indicating scale, would be connected across the collectors of the respective transistors $T_2$ and $T_3$, the voltmeter would not be impressed with voltage; that is, the voltage difference between the collectors would be equal to zero. If a magnetic field is directed upon the Hall plate with such an orientation that the positive pole of the Hall voltage is located at input terminal $E_2$ and the negative pole of this voltage at terminal $E_1$, then the transistor $T_3$ is controlled to shift from its point of idling, adjusted by means of resistor $R_{23}$, to a more conductive condition (i.e. turned on more), whereas the transistor $T_2$ is accordingly rendered less conductive (opened or turned off). As a result, the collector potential of transistor $T_3$ declines and a voltmeter connected between the respective collectors of transistor $T_2$, $T_3$ would show a deflection in one sense, and after reversed poling of the Hall voltage at the terminals $E_1$ and $E_2$, a deflection in the opposite sense.

The preamplified Hall-voltage signals are further amplified by transistors $T_1$ and $T_4$ whose emitters are connected to the respective collectors of transistors $T_2$ and $T_3$. The emitter of transistor $T_4$ is connected with the collector of transistor $T_3$, and the emitter of transistor $T_1$ is connected with the collector of $T_2$. The collectors of respective transistors $T_1$ and $T_4$ are connected through collector resistors $R_1$ and $R_4$ respectively with the negative pole N of the direct voltage source. Additionally, the collector of transistor $T_1$ is connected with an output terminal $A_2$ of the amplifier, and the collector of transistor $T_4$ is connected with the second output terminal $A_1$. The base of transistor $T_4$ connects through a protective resistor $R_5$ with a circuit point between diode $D_1$ and collector resistor $R_{22}$, whereas the base of transistor $T_1$ connects through a protective resistor $R_6$ with a circuit point between the diode $D_2$ and the collector resistor $R_{32}$.

When a magnetic field is active at the Hall plate H in such a direction that the plus pole of the Hall voltage is at input terminal $E_2$ and the minus pole at input terminal $E_1$ of the preamplifier circuit, then the output terminal $A_1$ of transistor $T_4$ carries a zero signal, whereas the output terminal $A_2$ of transistor $T_1$ simultaneously carriers an output or L-signal. However, when the minus pole of the Hall voltage is at input terminal $E_2$ and the plus pole at terminal $E_1$, then the conditions are reversed; that is, now the output terminal $A_1$ carriers an output or L-signal and the output terminal $A_2$ carries the zero or O-signal. However, when the Hall voltage at the input terminals $E_1$ and $E_2$ vanishes, for example when a magnetic field no longer acts upon the Hall plate H, the two output terminals $A_1$ and $A_2$ of the amplifier both carry an O-signal.

By virtue of the preamplification by means of the transistors $T_2$, $T_3$ and the subsequent amplification of the Hall-voltage signals by the switching transistors $T_1$, $T_4$, the L-signals at the output terminals $A_1$ or $A_2$ have an amplitude which is sufficient to reliably control the next following active or passive control components of a control system. However, in order to make certain that an output signal (L-signal) will occur at the output terminal $A_1$ or $A_2$ only if the Hall voltage at the input terminals $E_1$ and $E_2$ has a certain magnitude above a given threshold value, the push-pull symmetrical preamplifier is provided with the above-mentioned threshold diodes $D_1$ and $D_2$.

Signal transmitters of other types, for example photo-electric cells, magnetic pick-up coils, wire strain-gauge strips, measuring gauges, pressure gauges, or the like transducers which issue very small direct voltages requiring amplification before being further processed, can be connected to the input terminals $E_1$ and $E_2$ of the amplifier instead of the Hall-voltage generator H, and in the same manner as described above. Those sensors or transducers that do not require the supply of an energizing or control current need not be equipped with such components as shown at $R_2$ and $R_3$ between terminal points $F_2$ and $F_3$.

The entire amplifier, according to the circuit diagram shown in FIG. 1, is preferably accommodated in a closed housing which is preferably sealed or filled with casting resin. Such a housing is shown in FIG. 2. It comprises an insulating base B upon which the individual circuit components (not identified in FIG. 2) are mounted, and a cup or can C firmly joined with the base B. The interior of the can may be completely filled with casting resin for the purpose of reliably sealing the components. The base B is provided with connector plugs which in FIG. 2 are denoted by the same respective reference characters as the terminal or connecting points which according to FIG. 1 are to be attached electrically to these plug pins.

The amplifier of FIGS. 1 and 2 is particularly suitable in control systems operating without movable switching contacts by operation of logic circuit components. There it is possible, as a rule, to distinguish three functionally different types of components. The first component type is the input component constituted by the signal or command transmitter of the system. The input component forwards the control signals into the system, from such devices as actuating switches, position indicators, measuring gauges and other sensors, or transducers. Another group of components is constituted by those devices that respond to the input signals and effect the necessary processing thereof. This control portion of the system affords the performance of any necessary interlocking and intertying according to the required logic relations or the performance of a desired timing program. The third type or group of components is constituted by output means which, for example, supply and use power for the operation of electric contactors, magnetically operating valves, couplings or other devices and machinery.

The amplifier of FIGS. 1 and 2 is suitable for any of the above-mentioned input components or signal transmitters for control or signal processing systems, and particularly for signal transmitters which furnish the weak voltage signal but are required to be sufficiently reliable for the signal to be properly processed in the signal-responsive portion of the system. In known control systems of the type operating without movable switch contacts, the components of the signal-responsive control portion in the system usually require, for reliable performance of the proper control operations, an input voltage of about 10 volts. Consequently, the signal transmitters together with the amplifier according to the invention are capable of issuing a signal voltage in this order of magnitude. Suitable as proximity-type transmitter members for connection to the amplifier input is, for example, a photo-electric cell to operate as an optical-electrical signal transmitter. Also suitable is the transducer head of a pickup for magnetically stored signals, such as signals recording on magnetizable tape, such transducers operating by means of an inductance coil or by means of a Hall generator responsive to the passage of a magnetized locality on the magnetogram tape. For response to, or computation of, analog values, various other transmitter devices can be employed, for example such sensors as temperature gauges, pressure-responsive capsules, wire strain gauge strips, and various other transducers operating to translate the change in a physical magnitude into a corresponding electrical change of a voltage or current.

The amplifier according to the invention is stabilized in itself so that a change or fluctuation of its own feeder voltage or a change in the ambient temperatures does not result in appreciable changes in amplifying properties. Known amplifiers that meet these exacting requirements are relatively expensive compared to those according to the invention, especially if the operating conditions make it ncessary to amplify relatively small direct voltage signals. Consequently, in cases where the change of the physical magnitude to be supervised and responded to, for example a magnetic field strength sensed by a Hall generator, caused only an extremely minute voltage change at the output terminals of the sensor, then the necessary amplification of the signals required amplifier means that occupy comparatively much space and are very costly in comparison with the sensing or control equipment proper. This is avoided by the amplifier of FIGS. 1 and 2.

Aside from the fact that in many cases the energy change to be responded to is extremely slight as such, the yield or efficiency of the sensor or transducer may also be slight so that the resulting electric sensor voltages become disagreeably small, this being the case for example with strain-gauge strips or Hall plates. The consequence is that in such cases the reliable, accurate and stable amplification of these voltages furnished by the amplifier of FIGS. 1 and 2 is indispensable for raising the voltage level of the signal to a level that can be reliably processed in the control portion of the equipment.

FIGS. 1 and 2 illustrate an amplifier for matching a low-voltage signal transmitter or sensor to the electric input requirements of the control components that are to be responsive to the signal, while avoiding the abovementioned shortcomings of the amplifiers heretofore known for such purposes and providing a complete signal transmitter of sufficient and properly matched output which with respect to simplicity, space requirements and cost of components is greatly superior to the comparable devices of this type heretofore available.

I claim:

1. An amplifier system for amplifying a small signal, comprising a symmetrical push-pull preamplifier circuit having two branches which include the emitter-collector paths of two transistors having an emitter resistor in common and having respective collector resistors, each of said transistors having a base electrode having a signal input terminal connected thereto; a transducer of reversible voltage connected between said input terminals to supply a small signal voltage when the amplifier is in operative condition; and a switching-transistor network comprising two switching transistors, one of said switching transistors having a base electrode connected to the collector electrode of one of said preamplifier transistors and an emitter electrode connected to the collector electrode of the other of said preamplifier transistors, and the other of said switching transistors having a base electrode connected to the collector electrode of the other of said preamplifier transistors and an emitter electrode connected to the collector electrode of the one of said preamplifier transistors, and an output terminal connected to the collector electrode of each of said switching transistors, whereby one of said respective switching transistors at a time is controlled to provide an amplified signal depending upon the signal-responsive polarity of the amplified voltage at the collectors of said preamplifier transistors.

2. A sensor system comprising a Hall generator having two Hall-voltage electrodes; an amplifier comprising a pair of transistors having emitter, collector and base electrodes connected symmetrically and having respective inputs connected to each Hall-voltage electrode and having respective outputs; two switching amplifiers having respective paths of major current flow connected in series with each of said outputs and having respective control circuits connected to the opposite ones of said outputs; a first current source connected across said symmetrical amplifier and connected to said Hall-voltage generator for energizing it; a second current source connected to said switching amplifiers for energizing them; and means for deriving an output voltage from each of said switching amplifiers.

3. An amplifier system for amplifying a small signal, comprising a source of small signals having two terminals; a first source of current; a second source of current different from the first; a pair of amplifying transistors each having a base electrode, one terminal of said source of small signals being connected to the base electrode of one of said amplifying transistors and the other terminal of said source of small signals being connected to the base electrode of the other of said amplifying transistors, said amplifying transistors having respective emitters; a pair of adjusting resistors connecting said emitters to each other; a common emitter resistor connected to said adjusting resistors and connected to said first source of current whereby said amplifying transistors are connected in symmetrical amplifier relation; respective diodes connected to the collectors of said amplifying transistors; respective collector resistors connected to said diodes and connected to said first current source; two switching transistors having respective emitters connected to the collectors of said amplifying transistors and having respective bases and collectors; two coupling resistors each respectively connecting the diode connected to the collector of one of said amplifying transistors to the base of the switching transistor whose emitter is connected to the collector of the other of said amplifying transistors; two switching collector resistors connected to the collectors of said switching transistors and connected to said second current source; and means for deriving an output voltage from the collector of each of said switching transistors.

4. An amplifying system comprising a source of low voltage signals having two terminals; a pair of amplifying transistors having emitter, collector and base electrodes in symmetrical amplifier connection; means connecting one terminal of said source of low voltage signals to the base electrode of one of said amplifying transistors and means connecting the other terminal of said source of low voltage signals to the base electrode of the other of said amplifying transistors of said symmetrical amplifier connection; a pair of switching transistors having emitter, collector and base electrodes; coupling means connecting the collector electrode of each of said amplifying transistors to the emitter electrode of a respective switching transistor and to the base electrode of the other switching transistor; and means for deriving an output voltage from the collector electrode of each of said switching transistors.

5. An amplifying system comprising a source of low voltage signals having two terminals; a pair of amplifying transistors having emitter, collector and base electrodes in symmetrical amplifier connection; means connecting one terminal of said source of low voltage signals to the base electrode of one of said amplifying transistors and means connecting the other terminal of said source of low voltage signals to the base electrode of the other of said amplifying transistors of said symmetrical amplifier connection; a pair of switching transistors having emitter, collector and base electrodes; coupling means connecting the collector, electrode of each of said amplifying transistors to the emitter electrode of a respective switching transistor and to the base electrode of the other switching transistor; supply input means connected to the emitter and collector electrodes of said transistors for supplying separate sources of current to said amplifying transistors and said switching transistors; and means for deriving an output voltage from the collector electrode of each of said switching transistors.

References Cited by the Examiner

UNITED STATES PATENTS

| | | | |
|---|---|---|---|
| 2,560,320 | 7/1951 | Wrinkler | 330—67 X |
| 2,725,504 | 11/1955 | Dunlap | 330—6 X |
| 2,936,345 | 5/1960 | Kinkel | 330—74 |
| 2,989,623 | 6/1961 | Byrne | 330—16 X |
| 3,047,736 | 7/1962 | Dornhoeffer | 330—15 X |
| 3,050,688 | 8/1962 | Heyser | 330—24 |
| 3,078,379 | 2/1963 | Plogstedt et al. | 330—14 X |

FOREIGN PATENTS

| | | |
|---|---|---|
| 610,698 | 12/1960 | Canada. |

ROY LAKE, *Primary Examiner.*

NATHAN KAUFMAN, *Examiner.*